United States Patent
Cheung et al.

(10) Patent No.: US 6,552,674 B2
(45) Date of Patent: Apr. 22, 2003

(54) AUTOMATIC CONFIGURATION OF UNIVERSAL VARIABLE LENGTH CODE FOR VIDEO CODING

(75) Inventors: Ngai-Man Cheung, Tsukuba (JP); Yuji Itoh, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/077,126

(22) Filed: Feb. 15, 2002

(65) Prior Publication Data

US 2002/0186154 A1 Dec. 12, 2002

Related U.S. Application Data

(60) Provisional application No. 60/277,138, filed on Mar. 19, 2001.

(51) Int. Cl.[7] .................................................. H03M 7/40
(52) U.S. Cl. ............................................ 341/67; 345/65
(58) Field of Search ............................... 341/65, 67, 50

(56) References Cited

U.S. PATENT DOCUMENTS 6,501,801 B2 * 12/2002 Chujoh et al. ......... 375/240.23

* cited by examiner

Primary Examiner—Peguy JeanPierre
Assistant Examiner—Joseph J Lauture
(74) Attorney, Agent, or Firm—Robert D. Marshall; W. James Brady, III; Frederick J. Telecky, Jr.

(57) ABSTRACT

This invention is a method to automatically configure the universal variable length coding (UVLC). The method is applicable to code the syntax elements with a lot of symbols like the transform coefficients and motion vectors. The configuration problem includes a configuration method based on a genetic algorithm (GA). The method can be applied to on-the-fly configuration of codewords during video encoding, or to off-line training of code tables. This invention also includes several techniques to reduce the required operations for applications which have only limited processing power.

12 Claims, 2 Drawing Sheets

BITSTRING LENGTH = $\sum$ (LENGTH OF $r_k$)

AUTOMATIC CONFIGURATION OF UNIVERSAL VARIABLE LENGTH CODE FOR VIDEO CODING

This application claims priority under 35 USC §119(e)(1) of Provisional Application No. 60/277,138, filed Mar. 19, 2001.

TECHNICAL FIELD OF THE INVENTION

The technical field of this invention is variable length coding and particularly determination of the variable length coding code configuration used in video data compression.

BACKGROUND OF THE INVENTION

Variable length coding is a statistical coding technique that assigns symbols to codewords based on the occurrence frequency of the symbols. Symbols that occur more frequently are assigned short codewords while those that occur less frequently are assigned long codewords. Compression is achieved by the fact that overall the more frequent shorter codewords dominate. The variable length code (VLC) tables in video compression standards such as MPEG 1/2/4 and H.263 are fixed and optimized for a limited range of bit-rates. These fixed coding tables cannot handle a variety of applications. For example, in MPEG-2, the VLC tables for discrete cosine transform (DCT) coefficients are designed for broadcast quality video applications. These VLC tables cannot readily handle low bit-rate applications. Therefore, it is desirable to have a type of configurable VLC that can handle a wide range of applications and coding conditions. The universal variable length code (UVLC) proposed in Yuji Itoh, "Bi-directional motion vector coding using universal VLC," *Signal Processing: Image Communication,* Vol. 14, pp. 541–557, May 1999 is a new scheme to encode syntax elements and offers such an advantage. The UVLC tables are constructed by a dozen of coarse codes and construction rules. The UVLC can handle a wide range of applications and different syntax elements by changing the construction rules.

Although the UVLC can be configured to handle a variety of applications and coding conditions, the issue of how to configure the UVLC has not been well explored. In the prior art, the UVLC tables were designed empirically. This technique relies heavily on the expertise of the coder and typically requires many trials. Even with a great effort the resulting tables may not be optimum. Current methods to automatically re-configure the UVLC use the probability of each symbol to construct a mapping table that re-orders the assignments of symbols to codewords. This is suitable for coding syntax elements which have only a few different symbols, such as the macroblock type in H.26L video standard which has only 9 different symbols. This is not practical for syntax elements like transform coefficients or motion vectors, which consist of a lot of symbols. Since the transform coefficients and motion vectors make up a significant portion of the total encoded bits, it is foremost important to have a method capable of automatically configuring the UVLC for these syntax elements in different types of applications.

SUMMARY OF THE INVENTION

This invention is a method to automatically configure the universal variable length coding (UVLC). The method is applicable to code the syntax elements with a lot of symbols like the transform coefficients and motion vectors. The configuration problem includes a configuration method based on a genetic algorithm (GA). The method can be applied to on-the-fly configuration of codewords during video encoding, or to off-line training of code tables. This invention also includes several techniques to reduce the required operations for applications which have only limited processing power.

This invention selects variable length codes for encoding a plurality of symbols in a data stream, such as a series of video frames. The method determines a mapping of symbols to variable length codes as a bitstring. The method selects an initial population of a predetermined number of the bitstrings. The method calculates for each bitstring of a current population of bitstrings a number of bits needed for encoding the data stream from the mapping of symbols to variable length codes and the frequency of occurrence of each symbol. The method applies a termination condition to the current population of bitstrings.

If the current population of bitstrings passes the termination condition, the method selects the variable length codes corresponding to the bitstring having the least number of bits needed for encoding the data stream.

If the current population of bitstrings fails the termination condition, the method repeats the following steps. The method forms a next current population of bitstrings from the prior current population of bit strings by genetic manipulation of bitstrings of the current population. The method calculates the number of bits needed for encoding the data stream. The method applies the termination condition to the current population of bitstrings. These steps repeat until the termination condition is satisfied.

There are several alternative terminations conditions. The first termination condition is a predetermined number of repeats. The second termination condition is whether the number of bits for encoding the data stream of the current population of bitstrings differs by less than a predetermined amount from the immediately prior population of bitstrings. The third termination conditions is whether number of bits needed for encoding the data stream of one bitstring is less than a predetermined amount.

This method can be used for each frame of a video stream of a plurality of frames of more than one type. If there has been a prior selection of variable length codes for a frame of the type of the current frame that is sufficiently similar to the prior frame, the variable length encoding of the prior frame is used. This comparison may be by a chi-square test.

The chi-square test may employ only the most significant symbols of the video data stream for the comparison.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
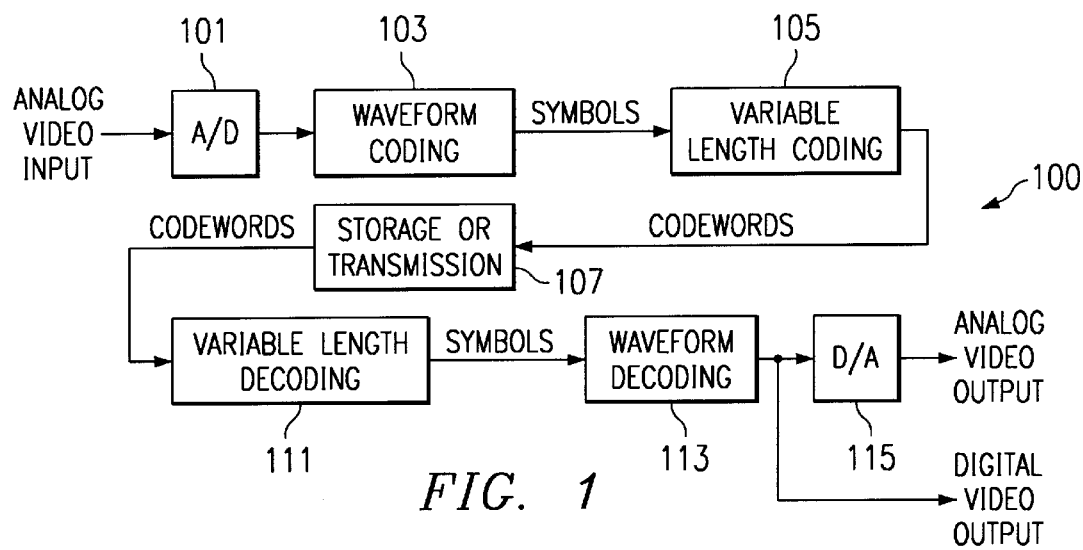
FIG. 1 illustrates the variable length coding of the prior art.
Figure 2:
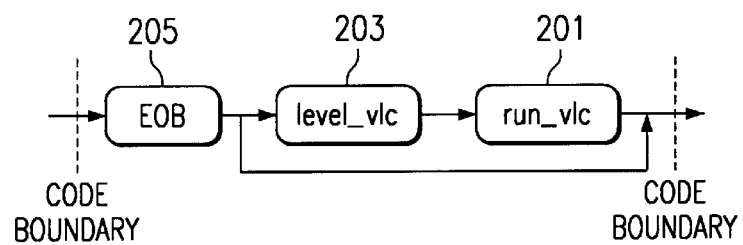
FIG. 2 illustrates an example of symbols input into the variable length codes.

FIG. 1 illustrates the known process 100 of data compression using variable length coding. In this example the input data is video, such as a movie or television show. The input analog image is converted to a stream of digital data in analog to digital converter 101. Individual frames of the digitized image data are converted into different types of symbols by waveform coding block 103. Typical operations of waveform coding block 103 include motion estimation and discrete cosine transform (DCT). Typical symbols from waveform coding block 103 include runs and levels of DCT coefficients, as illustrated in FIG. 2, motion vectors and macroblock types. The resultant symbols are encoded by variable length coding block 105 into codewords of different length. According to the known art, frequently occurring symbols are encoded into shorter codewords than infrequently occurring symbols. This variable length coding results in data compression. In the typical video coding standards, such as MPEG 1/2/4 and H.263, the variable length coding is fixed. These fixed codings represent a compromise based upon the expected data types to be encoded. The codeword data is stored or transmitted (block 107) in encoded form. The data compression of variable length coding requires less memory or less bandwidth than uncompressed data. Recovery of the original video is a reverse process. The codewords are decoded in variable length decoder block 111 into their corresponding symbols. The decoded symbols are converted into digital video frames in waveform decode block 113. The digital video frames may be converted into analog form in digital to analog converter 115 or employed in digital form.

FIG. 2 illustrates examples of symbols from waveform coder block 103. The symbols are runs 201 and levels 203 of the DCT coefficient, and an end of block marker 205. Table 1 shows a typical coding for level_vlc 203 and end of block 205 using the universal variable length (UVLC).

TABLE 1

| level_vlc | | Code | |
|---|---|---|---|
| coarse | additional | Size | Absolute Value of Level |
| 1 | s | 2 | 1 |
| 01 | | 2 | EOB |
| 001 | $x_0 s$ | 5 | "$x_0$" + 2(2:3) |
| 0001 | $x_1 x_0 s$ | 7 | "$x_1 x_0$" + 4(4:7) |
| 00001 | $x_2 x_1 x_0 s$ | 9 | "$x_2 x_1 x_0$" + 8(8:15) |
| 000001 | $x_3 x_2 x_1 x_0 s$ | 11 | "$x_3 x_2 x_1 x_0$" + 16(16:31) |
| 0000001 | $x_4 x_3 x_2 x_1 x_0 s$ | 13 | "$x_4 x_3 x_2 x_1 x_0$" + 32(32:63) |
| 00000001 | $x_5 x_4 x_3 x_2 x_1 x_0 s$ | 15 | "$x_5 x_4 x_3 x_2 x_1 x_0$" + 64(63:127) |

Where: s is the sign of the level, "0" indicating a positive sign and "1" indicating a negative sign. Table 2 shows a typical coding for run_vlc 201 using UVLC.

TABLE 2

| run_vlc | | Code | |
|---|---|---|---|
| coarse | additional | Size | Value of Run |
| 1 | | 1 | 0 |
| 01 | | 2 | 1 |
| 001 | $x_0$ | 4 | "$x_0$" + 2(2:3) |
| 0001 | $x_1 x_0$ | 6 | "$x_1 x_0$" + 4(4:7) |
| 00001 | $x_2 x_1 x_0$ | 8 | "$x_2 x_1 x_0$" + 8(8:15) |
| 000001 | $x_3 x_2 x_1 x_0$ | 10 | "$x_3 x_2 x_1 x_0$" + 16(16:31) |
| 0000001 | $x_4 x_3 x_2 x_1 x_0$ | 12 | "$x_4 x_3 x_2 x_1 x_0$" + 32(32:63) |

The UVLC also drastically simplifies the encoding and decoding process. Furthermore, a look-up table is not essential at either the encoder or decoder.

The method of this invention uses the distribution of symbols to determine a configuration for the UVLC such that the number of bits required to code the symbol is minimized. As shown in Tables 1 and 2, the universal variable length coding divides the symbols into several categories and assigns different coarse codes to each category. We look into how to determine the optimal partition. Let integer j, MIN_J, MAX_J denote the symbol value, the minimum and the maximum of the symbols, respectively. Thus MIN_J≦j≦MAX_J. Assume that the symbols are divided into L categories. Let integers $r_0, r_1, \ldots r_{L-1}$ denote the code sizes of the additional codes, and integers $t_0, t_1, \ldots t_{L-1}$ denote the boundary values of the categories. The kth category is $[t_k, t_{k+1}-1]$, and its range equals to $2^{r_k}$. The additional code sizes and the boundary values are related by the following equations:

$$t_{k+1} = t_k + 2^{r_k} \quad (1)$$

$$t_0 = MIN\_J \quad (2)$$

$$t_k = MIN\_J + 2^{r_0} + 2^{r_1} + \ldots + 2^{r_{k-1}} \quad (3)$$

Additionally:

$$r_{L-1} = \text{ceil}(\log_2(MAX\_J - MIN\_J - (2^{r_0} + 2^{r_1} + \ldots + 2^{r_{L-2}}) + 1)) \quad (4)$$

Let $c_k$, $cs_k$ be the coarse code size and the code size of the kth category, respectively. Since $r_k$ is the code size of the additional code, we have:

$$cs_k = c_k + r_k \quad (5)$$

This invention assigns short coarse codes to small symbols. Small symbols generally appear more frequently. Let $c_k = k+1$, then:

$$cs_k = r_k + k + 1 \quad (6)$$

Let $N_j$ be the number of occurrences of the symbol j. The total bits B used to encode the symbols is:

$$B = \sum_{k=0}^{L-1} \left( cs_k \times \sum_{j=t_k}^{t_{k+1}-1} N_j \right) \quad (7)$$

So the parameters $r_k$ from k=0 to L-2 determine the configuration of UVLC according to equations (1) to (4) and the total bits required to encode the symbol according to equations (6) and (7). The optimal set of $r_k$ values should minimize B. In the particular case of coding the symbols level_vlc 203 and end of block 205 illustrated in FIG. 2, the total bits used to encode the symbols is calculated as follows:

$$B = \sum_{k=0}^{L-1} \left( cs_k \times \sum_{j=t_k}^{t_{k+1}-1} N_j \right) + EOB\_len \times N_{EOB} \quad (8)$$

where: EOB_len is the size of the codeword for the end of block symbol; and $N_{NOB}$ is the number of occurrences of the end of block symbol.

This invention employs a genetic algorithm (GA) to determine the set of parameters $r_k$ that minimizes B. Genetic algorithms are search procedures modeled on the mechanics of natural selection. They have been found effective in different search and combinatorial optimization problems, thanks to the implicit parallelism property. Genetic algorithms may process $n^3$ possibilities in parallel with only n computations, where n is the size of population. Genetic algorithms also provide optimality in exploration and exploitation of information.

Figure 3:
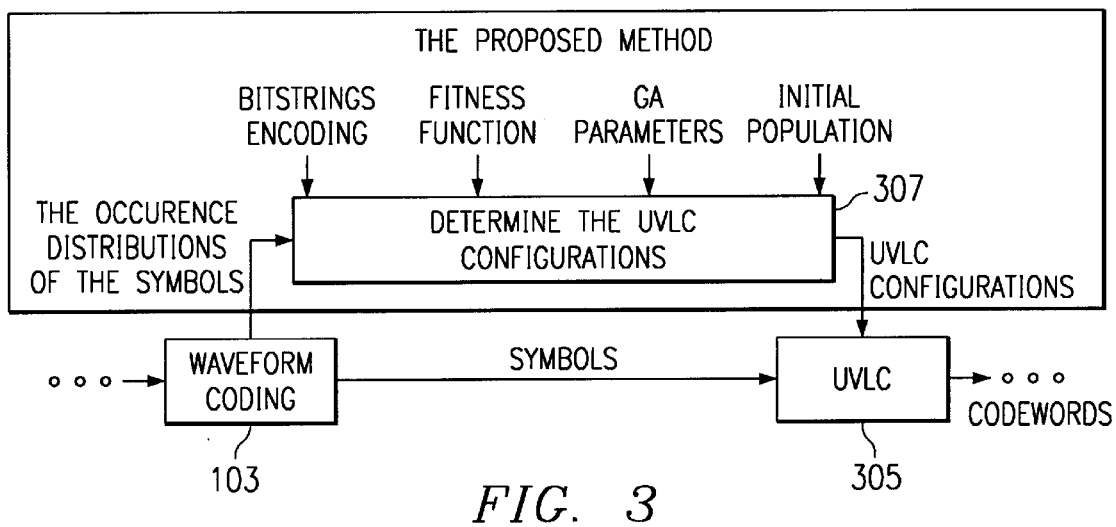
FIG. 3 illustrates application of the coding of this invention.

FIG. 3 illustrates the operation of this invention. The input digital video frames are converted to symbols by the waveform coding block 103. The symbols are converted into variable length codes in universal variable length coding block 305. The particular code configuration is determined by block 307. Block 307 receives an input from waveform coding block 103 indicating the distribution of the symbols. Block 307 also receives bitstring encodings, a fitness function, genetic algorithm parameters and an initial population of UVLC codings. In a manner further described below, block 307 determines the UVLC configuration for UVLC block 305.

Figure 4:
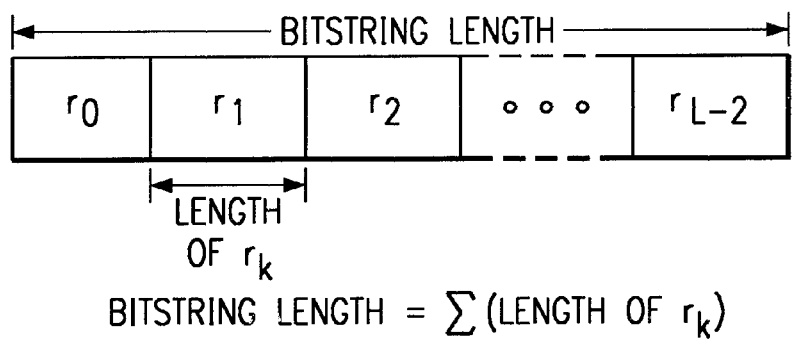
FIG. 4 illustrates the bitstring format used in the genetic algorithm of this invention.

The genetic algorithm (GA) maintains a population of candidate solutions encoded into bitstrings. In the preferred embodiment of this invention, the parameters $r_k$ are encoded into bitstrings as shown in FIG. 4. Table 3 lists the GA parameters used in the experiment.

TABLE 3

| Value to be Optimized | $B_{run}$ | $B_{level,\ luma}$ | $B_{level,\ chroma}$ |
|---|---|---|---|
| Maximum Number of Fitness Function Evaluations | | 2500 | |
| Population Size | | 50 | |
| Bitstring Length | 16 | 19 | 18 |
| Crossover Rate | | 0.6 | |
| Mutation Rate | | 0.001 | |

The values of the parameters in genetic algorithms are determined by several rules of thumb. The maximum number of fitness function evaluations is 2500 in the preferred embodiment. The genetic algorithm terminates at the earlier of when the total number of function evaluations equals 2500 or when the population converges. Convergence is determined from the distribution of the bit values B over the current population. In most cases the optimal candidates can be found in several tens of function evaluations.

Figure 5:
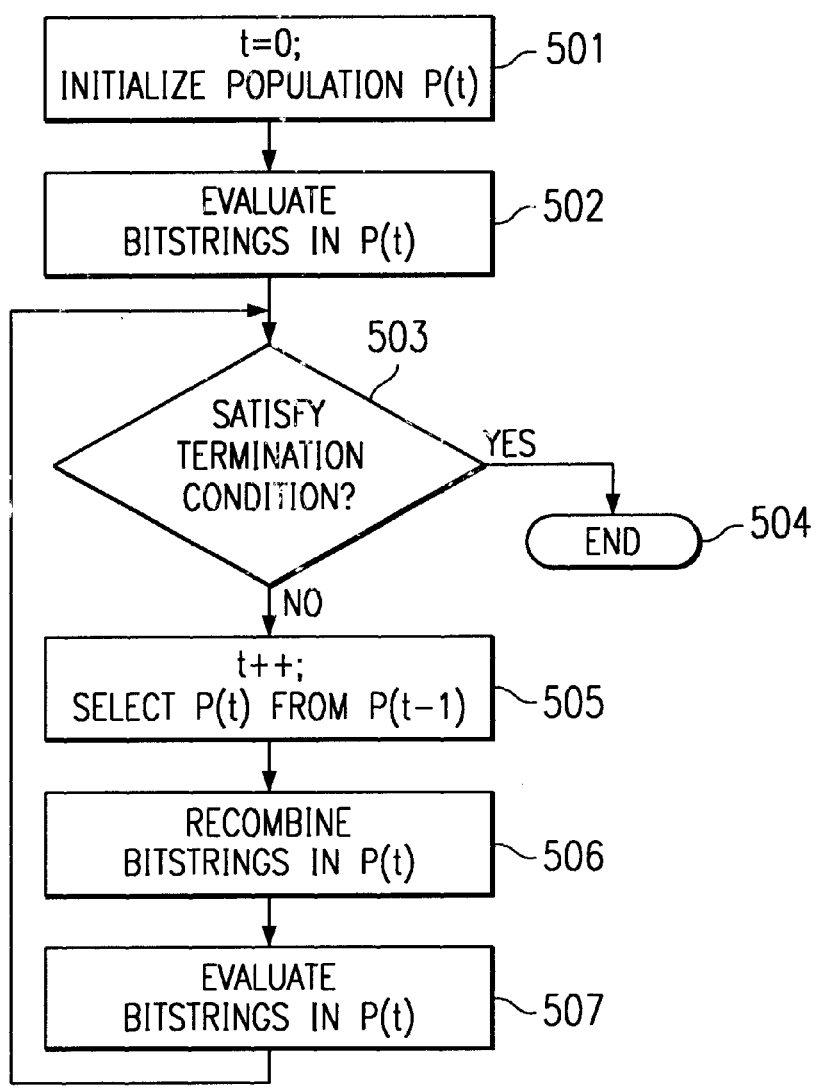
FIG. 5 illustrates the steps of the genetic algorithm of this invention.

FIG. 5 illustrates the operation of the genetic algorithm. The genetic algorithm begins with an initial population P(0) at block 501. This initial population P(0) is evaluated according to the fitness criteria at block 502. This includes calculating the total bits required in accordance with equation (7) above for each member of the population. The genetic algorithm next tests to determine if the termination conditions are satisfied at decision block 503. As noted above, one termination condition is a number of 2500 fitness evaluations. An alternate termination condition recognizes convergence of the population to an optimum value. Convergence can be detected by comparing the fitness values B of each member of the current population with a similar set of fitness values B of the prior population. Convergence is indicated when this comparison shows a change in the set of fitness values B below a threshold value. A final termination condition could be the existence of a fitness value B within the current population below a threshold value. Each of these termination conditions serves a different purpose. The maximum number of loops termination condition prevents the genetic algorithm from running endlessly without arriving at a solution. This enables the programmer to plan for real time operation knowing that the genetic algorithm will select a set of encodings within a predetermined time. Termination upon convergence prevents the genetic algorithm from operating under conditions not likely to find a better encoding. Termination upon reaching a predetermined fitness level permits selection of an encoding "good enough" for use without continuing on the chance that a better encoding can be found. Upon termination (Yes at decision block 503), the member of the population P(t) providing the least bits B is selected as the coding for the current video frame (end block 504).

If the termination conditions are not satisfied (No at decision block 503), then the next population P(t) is formed from the prior population P(t−1) at block 505. Generally those members of the population P(t−1) yielding the highest number of bits B in the prior evaluation are discarded. However, it is typical to retain some other population members to enhance the population diversity. New population members are formed by recombination of prior members at block 506. As noted in Table 3, there is a small chance that randomly selected bits are exchanged between population members (crossover) and that randomly selected bits within a single population member are changed (mutation). Either or both of these processes creates new population members. The newly constituted population P(t) is then evaluated according to the fitness criteria at block 507. This is the same evaluation as in block 502. The genetic algorithm then returns to decision block 503 to determine if a termination condition is satisfied. The genetic algorithm continues until a termination condition is satisfied (Yes at decision block 503) and a population member is selected for coding at block 504.

Review of the computation requirements of the genetic algorithm show that it can be performed in real time. Each evaluation of the fitness of the candidate solutions using Equation (7) it takes L multiplications and (MAX_J−MIN_J) additions. The number of fitness evaluations is limited to 2500 per genetic algorithm configuration. Thus he maximum required numbers of operations are 2500×L multiplications and 2500×(MAX_J−MIN_J) additions. This amount of computation is negligible for off-line applications. For real time applications, suppose the genetic algorithm is executed to configure UVLC for each video frame and assume an encoding speed of 30 frames per second. If the runs of the discrete cosine transform coefficients of an 8×8 block are coded, then MIN_J=0 and MAX_J=63. If the number categories of symbols L is 7, then the genetic algorithm loading in configuring UVLC is about 0.525 million multiplications per second and 4.725 million additions per second. This is insignificant when a current digital signal processor (DSP) can deliver up to 800 MMACS (million multiply-accumulate per second).

There are some methods to reduce the loading for applications which have only limited processing power. These methods only slightly degrade the quality of results. Firstly, instead of using all the symbols for fitness calculation of Equation (7), using only the first few significant symbols reduces computation. For example, when configuring UVLC for the runs of transform coefficients, we may include only up to symbol value 32 (instead of 63) in the fitness function. This should be adequate in differentiating the candidate solutions in most cases.

A second method to reduce required operations in particular for transform coefficients employs the similarity of adjacent pictures of the same type. The distributions of runs and levels of transform coefficients are highly correlated among pictures of the same type (I-picture, P-picture or B-picture). Note that according to the MPEG standards, an I-picture encodes all pixels of the frame, a P-picture differentially encodes pixels relative to a prior frame and a B-picture is bidirectionally interpolated between adjacent frames. Thus in many cases the configuration of the current picture may be applied to succeeding pictures of the same picture type without adversely degrading the picture. This permits omission of the genetic algorithm for these succeeding pictures. Suppose picture S0 has a distribution $D_{S0}$ and configuration $C_{S0}$. For each picture S1 succeeding S0 of the same picture type, this invention applies a chi-square test to compare the distributions $D_{S0}$ and $D_{S1}$. The chi-square test is:

$$\chi(D_{S0}, D_{S1}) = \sum_{j=0}^{L-1} \frac{(N_{j,S0} - N_{j,S1})^2}{N_{j,S0} + N_{j,S1}} \quad (9)$$

where: MIN_J is the minimum of the symbols; MAX_J is the maximum of the symbols; j is an index variable; $N_{j,S0}$ is the number of occurrences of the symbol value j in picture S0; and $N_{j,S1}$ is the number of occurrences of the symbol value j in picture S1. The pictures are similar if the chi-square value calculated according to Equation (9) is less than a predetermined threshold. It is possible to use only the first few symbols instead of all the symbols in the chi-square test to further save computations. If the chi-square test indicates the pictures are similar, then the first configuration $C_{S0}$ is applied to picture S1. If the chi-square test indicates the pictures $D_{S0}$ and $D_{S1}$ are different, then the genetic algorithm is performed on picture S1 to determine the optimal configuration $C_{S1}$. This configuration $C_{S1}$ will apply to the succeeding pictures of the same type if $D_{S1}$ and the distributions of the succeeding pictures are similar.

The following pseudocode listing summarizes this alternative.

```
for each picture S1 {
    similar = ( chi_square(D_S0, D_S1) < THRESHOLD );
    if (similar)
        apply C_S0 to picture S1;
    else {
        C_S1=Genetic_Algorithm(D_S1) ;
        apply C_S1 to picture S1;
        C_S0=C_S1;
        D_S0=D_S1; }
}
```

This second alternative employs the genetic algorithm to determine a new encoding only where the chi-square test indicates this new encoding set is likely to be different from the prior encoding. This saves computation by not determining a new encoding when the chi-square test indicates it will be little different from the prior encoding.

What is claimed is:

1. A method of selecting variable length codes for encoding a plurality of symbols in a data stream comprising the steps of:

determining a mapping of symbols to variable length codes as a bitstring;

selecting an initial population of a predetermined number of the bitstrings;

calculating for each bitstring of a current population of bitstrings a number of bits needed for encoding the data stream from the mapping of symbols to variable length codes and the frequency of occurrence of each symbol;

applying a termination condition to the current population of bitstrings;

if the current population of bitstrings passes the termination condition, selecting the variable length codes corresponding to the bitstring having the least number of bits needed for encoding the data stream; and if the current population of bitstrings fails the termination condition forming a next current population of bitstrings from the prior current population of bit strings by genetic manipulation of bitstrings of the current population, calculating for each bitstring of the current population of bitstrings the number of bits needed for encoding the data stream, applying the termination condition to the current population of bitstrings, and repeating the steps of forming a next current population of bitstrings, calculating the number of bits needed for encoding the data stream, and applying the termination condition and until the current population of bitstrings passes the termination condition.

2. The method of claim 1, wherein:

the step of calculating a number of bits needed for encoding the data stream calculates the following for each bitstring with the current population:

$$B = \sum_{k=0}^{L-1} \left( cs_k \times \sum_{j=t_k}^{t_{k+1}-1} N_j \right)$$

where: B is the number of bits to be calculated; L is a number of categories of symbols; k is an index variable; $cs_k$ is a code size of a kth category of symbols; j is an index variable; $t_k$ is a boundary value of the kth category; and $N_j$ is the number of occurrences within the data stream of the jth symbol.

3. The method of claim 1, wherein:

the step of applying the termination condition includes determining whether a predetermined number of repeats of the steps of forming a next current population of bitstrings, calculating the number of bits needed for encoding the data stream, and applying the termination condition have occurred.

4. The method of claim 1, wherein:

the step of calculating a number of bits needed for encoding the data stream calculates the following for each bitstring with the current population:

$$B = \sum_{k=0}^{L-1} \left( cs_k \times \sum_{j=t_k}^{t_{k+1}-1} N_j \right)$$

where: B is the number of bits to be calculated; L is a number of categories of symbols; k is an index variable; $cs_k$ is a code size of a kth category of symbols; j is an index variable; $t_k$ is a boundary value of the kth category; and $N_j$ is the number of occurrences within the data stream of the jth symbol; and the step of applying the termination condition includes determining whether the set of B values of the current population of bitstrings differs by less than a predetermined amount from the set of B values of an immediately prior population of bitstrings.

5. The method of claim 1, wherein:

the step of calculating a number of bits needed for encoding the data stream calculates the following for each bitstring with the current population:

$$B = \sum_{k=0}^{M} \left( cs_k \times \sum_{j=t_k}^{t_{k+1}-1} N_j \right)$$

where: B is the number of bits to be calculated; M is a number less than the number of categories of symbols; k is an index variable; $cs_k$ is a code size of a kth category of symbols; j is an index variable; $t_k$ is a boundary value of the kth category; and $N_j$ is the number of occurrences within the data stream of the jth symbol; and the step of applying the termination condition includes determining whether a least B value of the current population of bitstrings is less than a predetermined amount.

6. A method of selecting variable length codes for encoding a plurality of symbols in each frame of a video stream of a plurality of frames of more than one type, comprising the steps for each frame of:

determining if there has been a prior selection of variable length codes for a frame of the type of the current frame;

if there has been a prior selection of variable length codes for a frame of the type of the current frame, then comparing the prior frame with the current frame, and selecting the variable length codes selected for the prior frame for the current frame if the current frame is sufficiently similar to the prior frame;

if there has been no prior selection of variable length codes for a frame of the type of the current frame or if there has been such a selection and the current frame is not sufficiently similar to the prior frame, then determining a mapping of symbols to variable length codes as a bitstring;

selecting an initial population of a predetermined number of the bitstrings;

calculating for each bitstring of a current population of bitstrings a number of bits needed for encoding the data stream from the mapping of symbols to variable length codes and the frequency of occurrence of each symbol;

applying a termination condition to the current population of bitstrings;

if the current population of bitstrings passes the termination condition, selecting the variable length codes corresponding to the bitstring having the least number of bits needed for encoding the data stream; and if the current population of bitstrings fails the termination condition
  forming a next current population of bitstrings from the prior current population of bit strings by genetic manipulation of bitstrings of the current population,
  calculating for each bitstring of the current population of bitstrings the number of bits needed for encoding the data stream,
  applying the termination condition to the current population of bitstrings, and
  repeating the steps of forming a next current population of bitstrings, calculating the number of bits needed for encoding the data stream, and applying the termination condition and until the current population of bitstrings passes the termination condition.

7. The method of claim 6, wherein:
the step of calculating a number of bits needed for encoding the data stream calculates the following for each bitstring with the current population:

$$B = \sum_{k=0}^{L-1} \left( cs_k \times \sum_{j=t_k}^{t_{k+1}-1} N_j \right)$$

where: B is the number of bits to be calculated; L is a number of categories of symbols; k is an index variable; $cs_k$ is a code size of a kth category of symbols; j is an index variable; $t_k$ is a boundary value of the kth category; and $N_j$ is the number of occurrences within the data stream of the jth symbol.

8. The method of claim 6, wherein:
the step of applying the termination condition includes determining whether a predetermined number of repeats of the steps of forming a next current population of bitstrings, calculating the number of bits needed for encoding the data stream, and applying the termination condition have occurred.

9. The method of claim 6, wherein:
the step of calculating a number of bits needed for encoding the data stream calculates the following for each bitstring with the current population:

$$B = \sum_{k=0}^{L-1} \left( cs_k \times \sum_{j=t_k}^{t_{k+1}-1} N_j \right)$$

where: B is the number of bits to be calculated; L is a number of categories of symbols; k is an index variable; $cs_k$ is a code size of a kth category of symbols; j is an index variable; $t_k$ is a boundary value of the kth category; and $N_j$ is the number of occurrences within the data stream of the jth symbol; and the step of applying the termination condition includes determining whether the set of B values of the current population of bitstrings differs by less than a predetermined amount from the set of B values of an immediately prior population of bitstrings.

10. The method of claim 6, wherein:
the step of calculating a number of bits needed for encoding the data stream calculates the following for each bitstring with the current population:

$$B = \sum_{k=0}^{M} \left( cs_k \times \sum_{j=t_k}^{t_{k+1}-1} N_j \right)$$

where: B is the number of bits to be calculated; M is a number less than the number of categories of symbols; k is an index variable; $cs_k$ is a code size of a kth category of symbols; j is an index variable; $t_k$ is a boundary value of the kth category; and $N_j$ is the number of occurrences within the data stream of the jth symbol; and the step of applying the termination condition includes determining whether a least B value of the current population of bitstrings is less than a predetermined amount.

11. A method of claim 6, wherein:
the step of comparing the prior frame with the current frame calculates the following:

$$\chi^2(D_{S0}, D_{S1}) = \sum_{j=\text{MIN\_J}}^{\text{MAX\_J}} \frac{(N_{j,S0} - N_{j,S1})^2}{N_{j,S0} + N_{j,S1}}$$

where: MIN_J is the minimum of the symbols; MAX_J is the maximum of the symbols; j is an index variable; $N_{j,S0}$ is the number of occurrences of the symbol value j in picture S0; and $N_{j,S1}$ is the number of occurrences of the symbol value j in the current frame S1; and the step of selecting the variable length codes selected for the prior frame for the current frame if the current frame is sufficiently similar to the prior frame determines if $\chi^2(D_{S0}, D_{S1})$ is less than a predetermined value.

12. A method of claim 6, wherein:

the step of comparing the prior frame with the current frame calculates the following:

$$\chi^2(D_{S0}, D_{S1}) = \sum_{j=\text{MIN\_J}}^{\text{MAX\_J}} \frac{(N_{j,S0} - N_{j,S1})^2}{N_{j,S0} + N_{j,S1}}$$

where: MIN_J is the minimum of the symbols; MAX_J is the maximum of the symbols; j is an index variable; $N_{j,S0}$ is the number of occurrences of the symbol value j in picture S0; and $N_{j,S1}$ is the number of occurrences of the symbol value j in the current frame S1; and the step of selecting the variable length codes selected for the prior frame for the current frame if the current frame is sufficiently similar to the prior frame determines if $\chi^2(D_{S0}, D_{S1})$ is less than a predetermined value.

\* \* \* \* \*